US010468085B2

(12) United States Patent
Vimercati et al.

(10) Patent No.: US 10,468,085 B2
(45) Date of Patent: *Nov. 5, 2019

(54) REDUNDANCY ARRAY COLUMN DECODER FOR MEMORY

(71) Applicant: Micron Technology, Inc., Boise, ID (US)

(72) Inventors: Daniele Vimercati, El Dorado Hills, CA (US); Xinwei Guo, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/105,790

(22) Filed: Aug. 20, 2018

(65) Prior Publication Data

US 2018/0374527 A1 Dec. 27, 2018

Related U.S. Application Data

(60) Continuation of application No. 15/689,940, filed on Aug. 29, 2017, now Pat. No. 10,121,526, which is a
(Continued)

(51) Int. Cl.
*G11C 11/22* (2006.01)
*G11C 29/00* (2006.01)

(52) U.S. Cl.
CPC ........ *G11C 11/221* (2013.01); *G11C 11/2259* (2013.01); *G11C 11/2273* (2013.01);
(Continued)

(58) Field of Classification Search
CPC .............. G11C 11/221; G11C 11/2259; G11C 11/2273; G11C 29/781; G11C 29/804; G11C 29/806; G11C 29/816
(Continued)

(56) References Cited

U.S. PATENT DOCUMENTS 5,255,228 A 10/1993 Hatta et al.
5,587,947 A 12/1996 Chang et al.
(Continued)

OTHER PUBLICATIONS

ISA/KR, International Search Report and Written Opinion of the International Searching Authority, Int'l. Appl. No. PCT/US2017/047779.
(Continued)

*Primary Examiner* — Ly D Pham
(74) *Attorney, Agent, or Firm* — Holland & Hart LLP

(57) ABSTRACT

Methods, systems, and apparatuses for redundancy in a memory array are described. A memory array may include some memory cells that are redundant to other memory cells of the array. Such redundant memory cells may be used if a another memory cell is discovered to be defective in some way; for example, after the array is fabricated and before deployment, defects in portions of the array that affect certain memory cells may be identified. Memory cells may be designated as redundant cells for numerous other memory cells of the array so that a total number of redundant cells in the array is relatively small fraction of the total number of cells of the array. A configuration of switching components may allow redundant cells to be operated in a manner that supports redundancy for numerous other cells and may limit or disturbances to neighboring cells when accessing redundancy cells.

15 Claims, 10 Drawing Sheets

Related U.S. Application Data division of application No. 15/258,852, filed on Sep. 7, 2016, now Pat. No. 9,779,796.

(52) U.S. Cl.
CPC .......... *G11C 29/781* (2013.01); *G11C 29/804* (2013.01); *G11C 29/806* (2013.01); *G11C 29/816* (2013.01)

(58) Field of Classification Search
USPC ............................................ 365/145, 63, 65
See application file for complete search history.

(56) References Cited

U.S. PATENT DOCUMENTS

| | | | |
|---|---|---|---|
| 5,650,975 | A | 7/1997 | Hamade et al. |
| 5,959,878 | A | 9/1999 | Kamp |
| 6,545,904 | B2 | 4/2003 | Tran |
| 6,590,817 | B2 | 7/2003 | Siek |
| 6,819,604 | B2 | 11/2004 | Yamada |
| 6,826,068 | B1 | 11/2004 | Shiga et al. |
| RE38,944 | E | 1/2006 | Takahashi et al. |
| 7,154,803 | B2 | 12/2006 | Martinelli et al. |
| 7,170,802 | B2 | 1/2007 | Cernea et al. |
| 7,209,398 | B2 | 4/2007 | Miyakawa et al. |
| 7,227,782 | B2 | 6/2007 | Lee et al. |
| 9,748,001 | B2 | 8/2017 | Li et al. |
| 2002/0130348 | A1* | 9/2002 | Tran .................. H01L 27/10873 257/306 |
| 2003/0016577 | A1* | 1/2003 | Siek ...................... G11C 11/404 365/201 |
| 2003/0026142 | A1* | 2/2003 | Yamada ............... G11C 29/789 365/200 |
| 2005/0232035 | A1 | 10/2005 | Miyakawa et al. |
| 2013/0117636 | A1 | 5/2013 | Kim et al. |

OTHER PUBLICATIONS

Nov. 29, 2017, Korean Intellectual Property Office, Seo-gu, Daejon, Republic of Korea, 13 pgs.

* cited by examiner

1100

REDUNDANCY ARRAY COLUMN DECODER FOR MEMORY

CROSS REFERENCE

The present Application for Patent is a continuation of U.S. patent application Ser. No. 15/689,940 by Vimercati et al., entitled "Redundancy Array Column Decoder for Memory," filed Aug. 29, 2017, which is a divisional of U.S. patent application Ser. No. 15/258,852 by Vimercati et al., entitled "Redundancy Array Column Decoder for Memory," filed Sep. 7, 2016, assigned to the assignee hereof, and each of which is expressly incorporated by reference in its entirety herein.

BACKGROUND

The following relates generally to memory devices and more specifically to redundancy array column decoder for non-volatile memory, such as ferroelectric memory.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. In certain FeRAM designs (among other design types), components of cells may processed or manufactured, with non-ideal or undesirable characteristics or communications that renders the cells or other components unusable. Building redundancy into an array may help mitigate some of these issues, and may avoid a need to abandon an entire array, but redundant cells or components that go unused may be an inefficient use of valuable die area.

BRIEF DESCRIPTION OF THE DRAWINGS

Example embodiments of the present disclosure are described with reference to the following figures.

DETAILED DESCRIPTION

Figure 1:
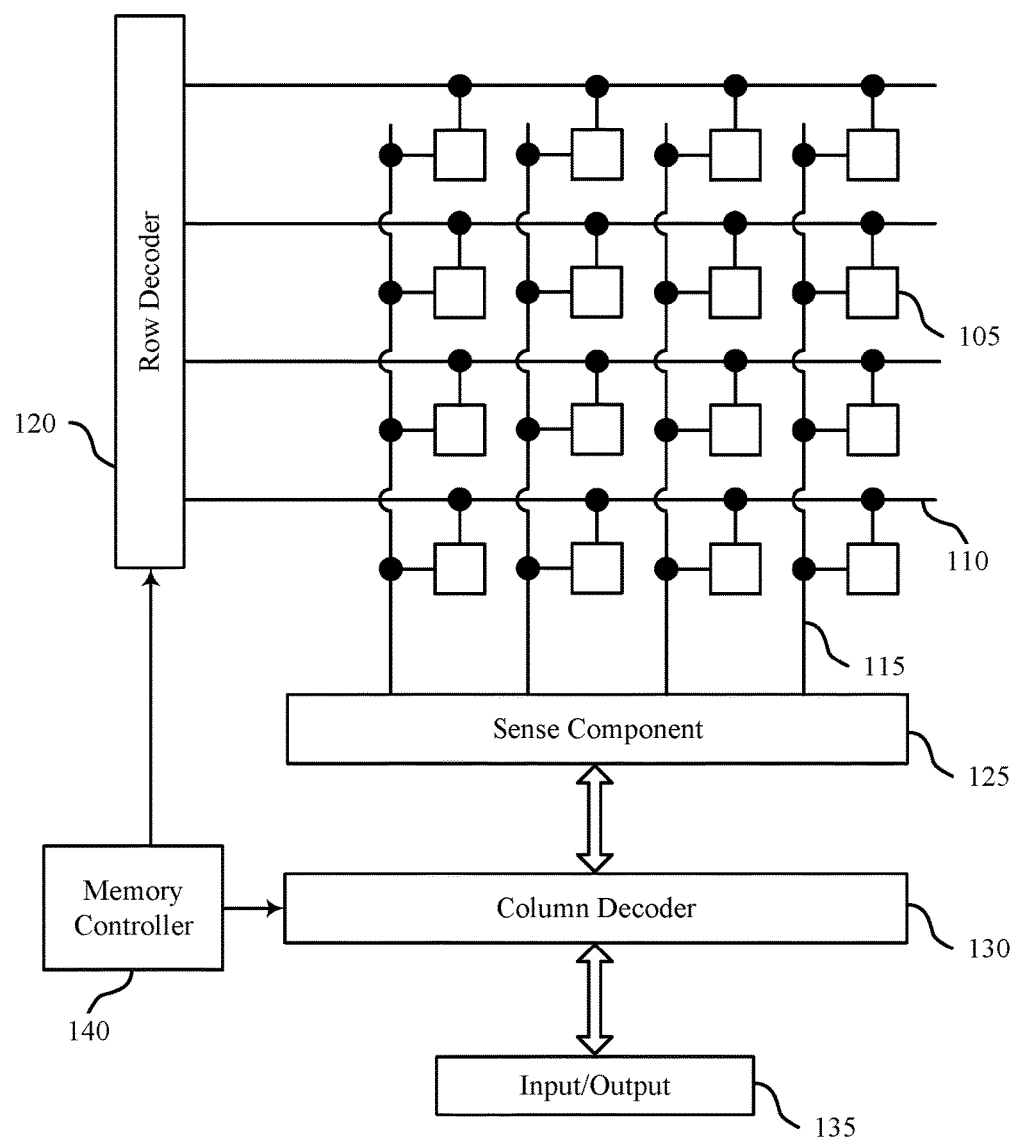
FIG. 1 illustrates an example memory array that supports a redundancy array column decoder for memory in accordance with embodiments of the present disclosure.

In memory designs, when long traces or continuous portions of memory elements are printed, the risk of unintentional defects increases. Building redundancy, such as a portion of the array with cells that are connected in a way that offers redundancy to several other cells, may help mitigate the problems due to manufacturing defects in way that efficiently uses available die space.

By way of example, process or manufacturing defects may create operational problems and may render parts of or whole memory arrays unusable. In some array designs, cell plates and other elements are close together, and there is a risk of unintentional current and other relationships between cell plates, including, but not limited to, adjacent cell plates. Based on manufacturing or other actions, cell plates may have a current relationship with or other defects relative to neighboring cell plates. Such relationships or defects may weaken or prohibit performance of one or more of the cell plates. Examples of such, relationships include shorts, parasitic fields or signals, and the like.

Some cell plates may include vertically cut cell plates that may be common among a small number of digit lines (e.g., 2 to 16) and a relatively large number of word lines (e.g., 512 to 1024). The manner in which cell plates are formed during manufacturing may affect array performance. In some instances, because the distance between respective cell plates is relatively narrow (e.g., like the distances between digits lines, word lines) then an electric current relationship may exist between the cell plates. A current relationship (e.g., a short) between cell plates of a group may render the group, the section, or some other memory elements inoperative. In some cases, the risk of shorting between cells may cause manufacturers to employ expensive wholesale or local redundancies, or both; and the risk of such deficiencies may promote other, relatively complex solutions, including more robust design parameters (e.g., increasing spacing between plates). These alternatives increase costs and decrease memory design functions and capabilities.

As described herein, memory arrays may be created and operated to mitigate risk of defects. For example, a redundancy group of cell plates may be built into the memory array. If one or more of the cell plates are rendered unusable by one or more of the defects or relationships described above, the memory array be configured to select the defective cell plate's related redundant cell plate. An area on the memory array may be allocated to the redundant cell plates. Allocating space to redundant cell plates adds cost to producing the memory array. As described herein, a group of redundancy cell plates may be designed to reduce the amount of area occupied by the redundancy cell plates. For example, redundancy cell plates may be associated with multiple cell plates of the normal cell plate groups.

In addition, a memory array using FeRAM technology may be designed to decouple unselected memory cells, or regions of the memory from selected memory cells, cells plates, or regions during an access operation. In some examples, undesired voltages or currents may result on unselected memory cells or unselected cell plates when another memory cell or cell plate is selected as part of an access operation. As described herein, a set of shunt control lines and shunt switching components may be configured to reduce biasing across unselected memory cells or unselected memory plates by grounding (or virtually grounding) the unselected elements of the memory array during an access operation. In some embodiments, the redundancy cell plate group of a memory array may also include shunt switching components to isolate a cell plate of the redundancy group during an access operation. In some examples, the selection switching components may also be positioned on the shunt control lines of the redundancy group. In this manner, additional area of the memory array may be preserved.

Features of the disclosure introduced above are further described below in the context of a memory array, and in other contexts. Specific embodiments are then described for cell plates, including vertically cut cell plates and the selection of cell plates and related operations, among others. These and other embodiments of the disclosure are further illustrated by and described with reference to apparatus diagrams, system diagrams, and flowcharts that relate to a redundancy array column decoder for ferroelectric memory.

In the present disclosure, a cell plate and a plate are used synonymously, unless the specific embodiment or embodiments indicates otherwise. In the present disclosure, a normal cell group may refer to portions of a memory array intended to be used as part of a normal operation of the memory array when the array is manufactured without defects, while a redundant cell group may refer to portions of a memory array designed to be a back-up cell group in case a normal cell group or cells of the normal cell group is defective.

FIG. 1 illustrates an example memory array 100 that supports a redundancy array column decoder for ferroelectric memory in accordance with various embodiments of the present disclosure. In the disclosure, reference is made to ferroelectric memory for ease of comprehension and without limitation. It should be appreciated that various aspects of the disclosure may also apply to other memory technologies.

Memory array 100 may also be referred to as an electronic memory apparatus. Memory array 100 includes memory cells 105 that are programmable to store different states. Memory array 100 may include some cells 105 or a portion of the array that is designated to be redundant to other cells 105 in the array.

If defects are identified in the array (e.g., as a result of processing), then redundant cells 105 may be used instead of cells 105 that have or are associated with the identified defects.

Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate word line 110 and digit line 115. Word lines 110 may also be referred to as access lines and digit lines 115 may also be referred to as bit lines. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115.

By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. In some embodiments, one or more read or write operations may be based on or derived from one or more selections of cell plates.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110 and multiple digit lines 115. Thus, by activating a word line 110 and a digit line 115, the memory cell 105 at their intersection may be accessed. As discussed herein, in various embodiments, the address or location of one or more cells or cell plates may affect identifications, determinations, or selections related to cell plates, among other elements or components. In some embodiments, the address or the location of memory cells may affect a selection, such as a selection based on an absolute address or location or a relative address or location. In some embodiments, the address or the location of a memory cell and the existence of an electric current relationship may affect a selection of plate pairs, in cell plate group or across cell plate groups.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some embodiments, memory controller 140 may be related to or in electronic communication with a first plate line and a second plate line, each of which may be coupled with plates of various cells 105. Groups of cells 105 that are in electronic communication with the same plate line may be referred to as a cell group or cell plate group. A first digit line may be in electronic communication with the first plate line and a first sense component (e.g., a sense amp) via a first selection component (e.g., a transistor). A second digit line may be in electronic communication with the second plate line and a ground or virtual ground (e.g., Vss) via a second selection component (e.g., a transistor). Based at least in part on the electronic communication, the memory controller 140 may be operable to initiate or perform one or more access operations, which may include applying a voltage to one or more plate lines in order to increase the voltage of a cell 105 plate. The process may be referred to a moving a cell plate, which may excite the cell and thus facilitate an access operation on the cell.

In some embodiments, the memory controller 140 may be operable to apply a voltage or cause a voltage to be applied to a plate line of a redundant cell group in the memory array based at least in part on a corresponding normal cell group being defective in some way. In some embodiments, the memory controller 140 may be operable to isolate unselected cells, in both a normal cell group and a redundant cell group, from selected memory plate lines using switching components and shunt control lines.

Figure 2:
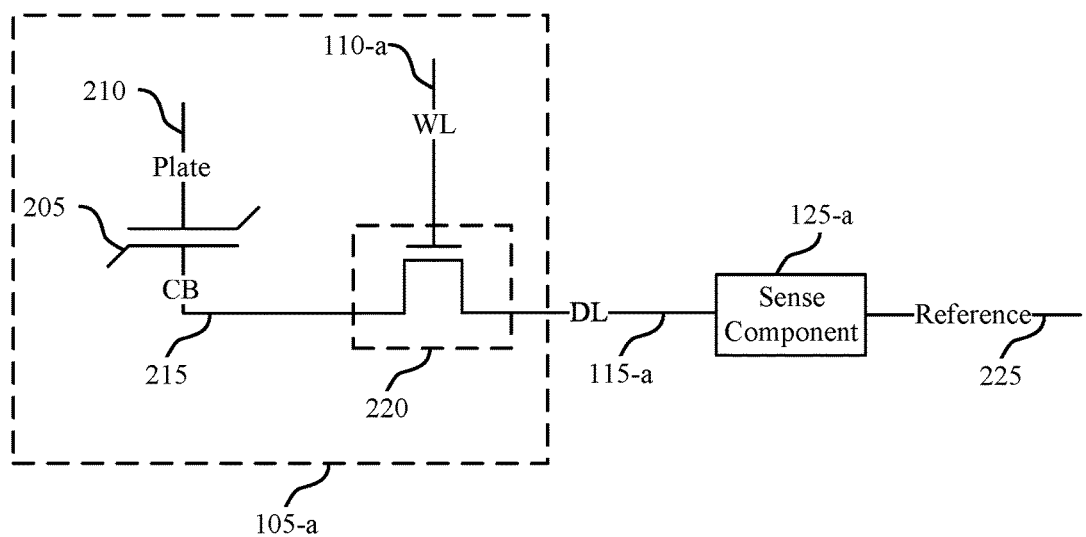
FIG. 2 illustrates an example circuit of a memory cell that supports a redundancy array column decoder for memory in accordance with embodiments of the present disclosure.

FIG. 2 illustrates an example circuit 200 that supports a redundancy array column decoder for ferroelectric memory in accordance with various embodiments of the present disclosure. In the disclosure, reference is made to ferroelectric memory for ease of comprehension and without limitation. It should be appreciated that various aspects of the disclosure may also apply to other memory technologies. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 210 and a second plate, cell bottom 215. Cell plate 210 and cell bottom 215 may be capacitively coupled through a ferroelectric material positioned between them. The orientation of cell plate 210 and cell bottom 215 may be flipped without changing the operation of memory cell 105-a. Circuit 200 also includes selection component 220 and reference line 225. Cell plate 210 may be accessed via a plate line that is electronic communication with several cells of a cell group, and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate 210. In some cases, digit line 115-a is virtually grounded and then isolated from the virtual ground, which may be referred to as "floating," prior to biasing plate 210 and word line 110-a. Biasing plate 210 may result in a voltage difference (e.g., plate 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 210 may be referred to as moving the cell plate.

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used in some cases.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage.

In some cases, the sense amplifier may additionally drive the digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate 210) and cell bottom 215 (through digit line 115-a). To write a logic 0, cell plate 230 may be taken high, that is, a positive voltage may be applied to plate 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Two or more sense components 125-a may each sense the voltage or other characteristics at two or more digit lines 115-a that each correspond to one or more plates 210. In some embodiments, each of these plates 210 may be associated with at least one redundant cell, and the redundant cell may be accessed if its associated normal cell is determined to be defective. In some embodiments, plate lines of adjacent cells may be isolated from one another during an access operation to prevent unwanted voltages or currents on unselected memory cells. By using the redundancy and isolation techniques of the present disclosure and an area occupied by the memory array may be reduced and the redundancy cell plates may be isolated.

Figure 3:
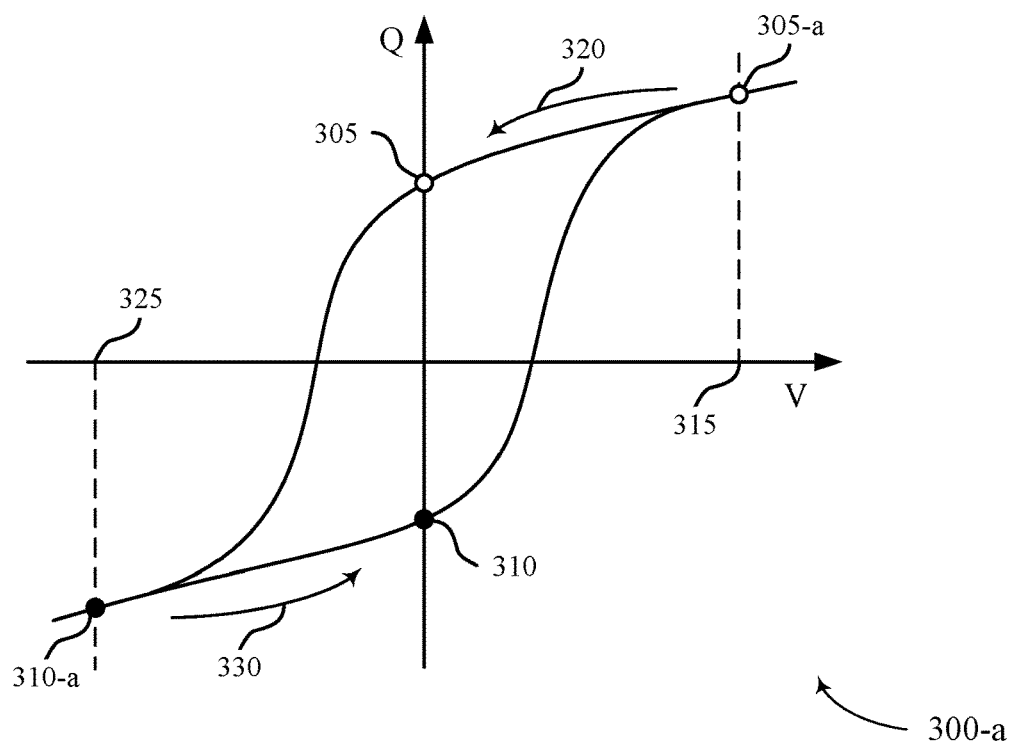
FIG. 3 illustrates example hysteresis curves for a ferroelectric memory cell that supports a redundancy array column decoder for memory in accordance with embodiments of the present disclosure.
Figure 3:
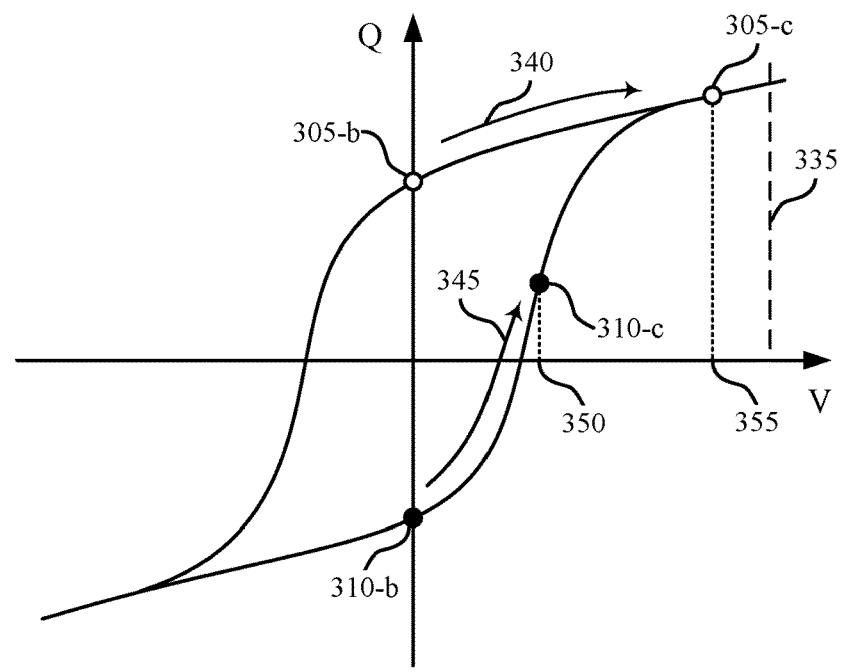

FIG. 3 illustrates an example of non-linear electrical properties with hysteresis curves 300-a and 300-b for a ferroelectric memory cell that is operated in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-*a*, the ferroelectric material may maintain a positive or negative polarization with a zero voltage difference, resulting in two possible charged states: charge state 305 and charge state 310. In some examples, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage potential. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-b illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction. In some embodiments, redundant memory cells may be included in a memory array. The redundant cells may be constructed of the same material, and may thus have the same ferroelectric properties, as other cells of the array. In some embodiments, to further protect stored logic on a ferroelectric memory cells, unselected memory cells may be isolated from selected memory cells during an access operation.

Figure 4:
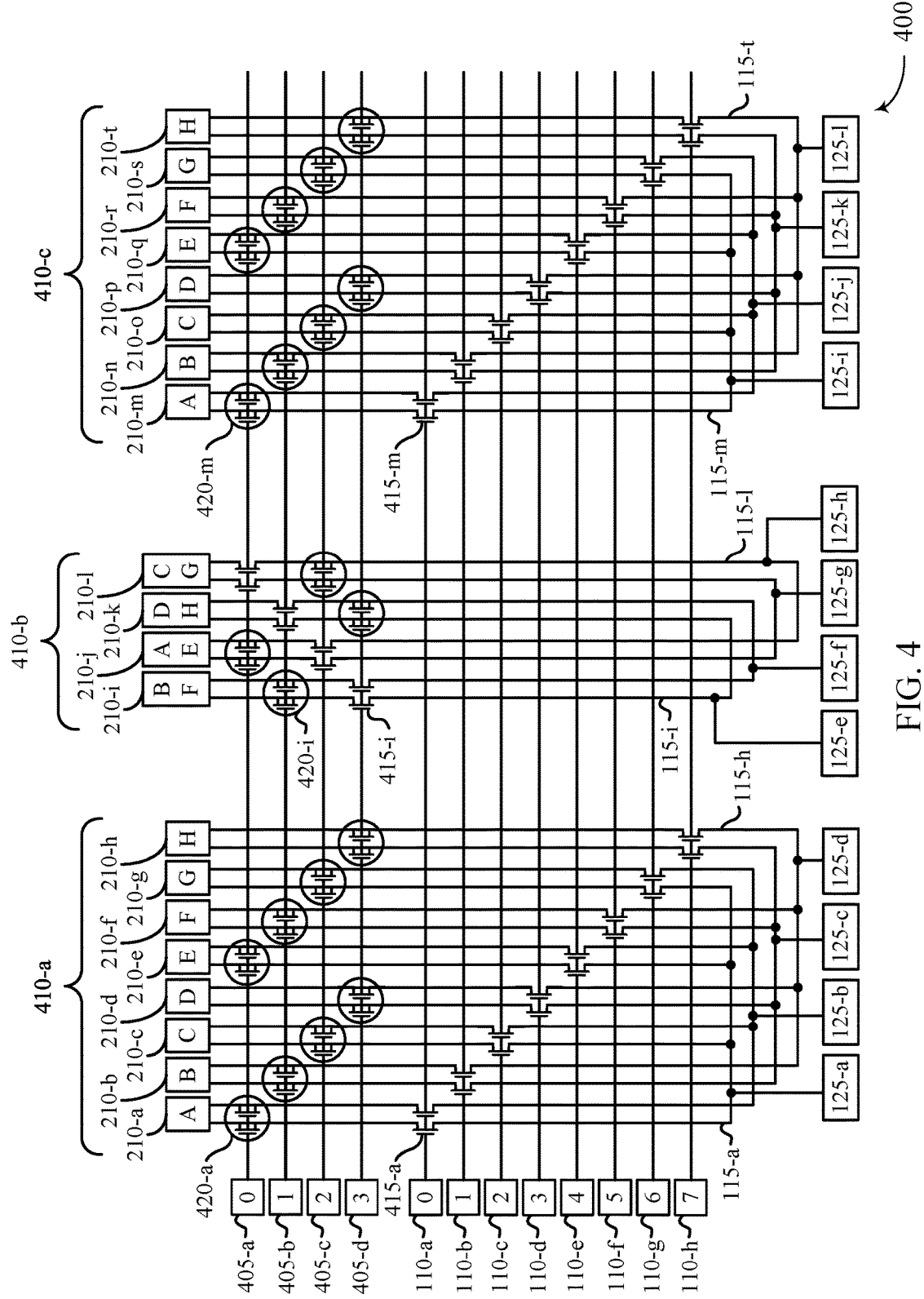
FIG. 4 illustrates an example of a memory array and other components that support a redundancy array column decoder for memory in accordance with embodiments of the present disclosure.

FIG. 4 illustrates an example array 400 that supports a redundancy array column decoder for ferroelectric memory in accordance with various embodiments of the present disclosure. In the disclosure, reference is made to ferroelectric memory for ease of comprehension and without limitation. It should be appreciated that various aspects of the disclosure may also apply to other memory technologies. Array 400 may include a ferroelectric memory cells, including plates (e.g., 210-*a* to 210-*t*), and, one or more word lines (e.g., 110-*a* to 110-*h*), digit lines (e.g., 115-*a* to 115-h, 115-*i* to 115-*l*, 115-*m* to 115-*t*, etc.), sense components (e.g., 125-*a* to 125-*d*, 125-*h* to 125-l, etc.) and shunt control lines (e.g., 405-*a* to 405-d), which may be examples of a memory cell 105 (and plates 210), word line 110, digit line 115, sense component 125, and selection component 220, respectively, as described with reference to FIGS. 1, 2, or others. These terminals may be separated by an insulating ferroelectric material. As described above, various states may be stored by charging or discharging capacitor 205.

The cell plates 210 of the array 400 may be grouped so that plates 210 of various memory cells are operated concurrently or during a common access operation. Array 400 may include cell plate groups 410-*a*, 410-*b*, and 410-*c*. Each of the plate groups 410 may include one or more cell plates 210 or plate lines in electronic communication with cell plates 210. For example, plate group 410-*a* may include cell plates 210-*a* to 210-*h*, plate group 410-*b* may include cell plates 210-*i* to 210-*l*, and plate group 410-*c* may include cell plates 210-*m* to 210-*t*. In some examples, different plate groups 410 may perform different functions in the array 400. For example, plate groups 410-*a* and 410-*c* may include normal cell plates 210 designed to be used during the normal operation of the array 400. As such, plate groups 410-*a* and 410-*c* may be referred to as normal cell plate groups. A first set of switching components may be associated with each cell plate group 410-*a* and 410-*c*. In some examples, the first set of switching components may include a first subset of switching components that provide a first functionality and a second subset of switching components that provide a second functionality. The switching components are discussed in greater detail below.

Plate group 410-*b* may include redundant cell plates 210 designed to be used only when a normal cell plate is defective. As such, plate group 410-*b* may be referred to as a redundant plate group because the cell plates in plate group 410-*b* are redundant to the certain cell plates in plate groups 410-*a* and 410-*c*. A second set of switching components may be associated with plate group 410-*b*. In some examples, the second set of switching components may include a first subset of switching components that provide a first functionality and a second subset of switching components that provide a second functionality. The switching components are discussed in greater detail below.

In some examples, the redundant cell plate group 410-*b* may be associated with multiple normal cell plate groups (e.g., plate groups 410-*a*, 410-*c*). In some examples, the redundant cell plate group 410-*b* may be associated with a single normal plate group 410. A cell plate group 410 may include any number of cell plates. In the illustrative example of FIG. 4, the normal cell plate groups 410-*a*, 410-*c* include eight cell plates 210 and the redundant cell plate group 410-*b* includes four cell plates 210. However, in other examples, each of these plate groups 410 may include more or less cell plates 210. For example, in the illustrative example of FIG. 7, a normal cell plate group 710 includes sixteen cell plates 210 and a redundant cell plate group 720 includes four cell plates 210. In some examples, a number of cell plates 210 in a redundant cell plate group may be an integer multiple of a number of cell plates 210 in an associated normal cell plate group. In some examples, the number of cell plates 210 in a redundant plate group corresponds to a number of shunt control lines 405 in the array 400. For example, in the illustrative example, there are four shunt control lines and four redundant cell plates (e.g., 210-*i* to 210-*l*). In other examples, however, the number of shunt control lines and redundant cell plates in a redundant plate group are not always equal.

The array 400 may also include selection switching components 415 (e.g., 415-*a* to 415-*h*, 415-*i* to 415-*l*, and 415-*m* to 415-*t*, etc.). In some examples, the selection switching components 415 may be positioned at intersections of word lines 110 and digit lines 115 and may be connected to a digit line 115 and a word line 110. In some examples, the selection switching components 415 may be positioned at intersections of shunt control lines 405 and digit lines (e.g., 415-*k* to 415-*n*). The selection switching components 415 may be configured to electronically couple a cell plate 210 to a sense component 125 based at least in part on a select line being selected (e.g., word line 110 or shunt control line 405). For example, selection switching component 415-*a* may be configured to connect cell plate 210-*a* to sense component 125-*a* based at least in part on word line 110-*a* being selected. The selection switching components 415 may be similarly embodied as the selection component 220 discussed above. In some embodiments, the selection switching components 415 may be or include a transistor and its operation may be controlled by applying a voltage to a transistor gate, where the voltage has a magnitude greater than the threshold magnitude of the transistor.

Figure 6:
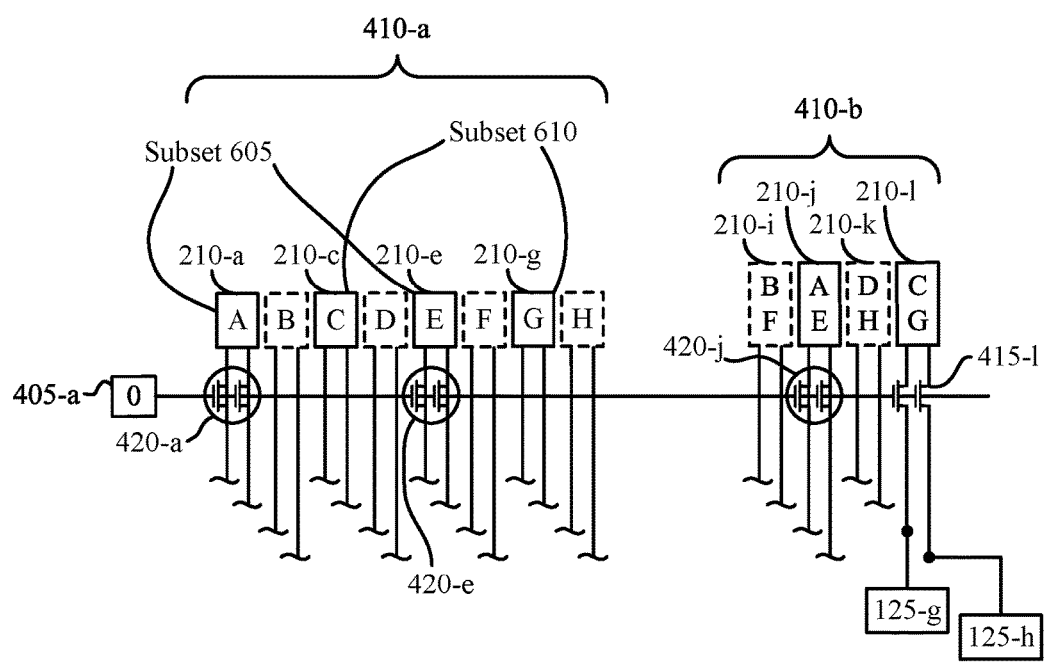
FIG. 6 illustrates an example of one or more relationships of a memory array and other components that supports redundancy array column decoder for memory in accordance with embodiments of the present disclosure.
Figure 7:
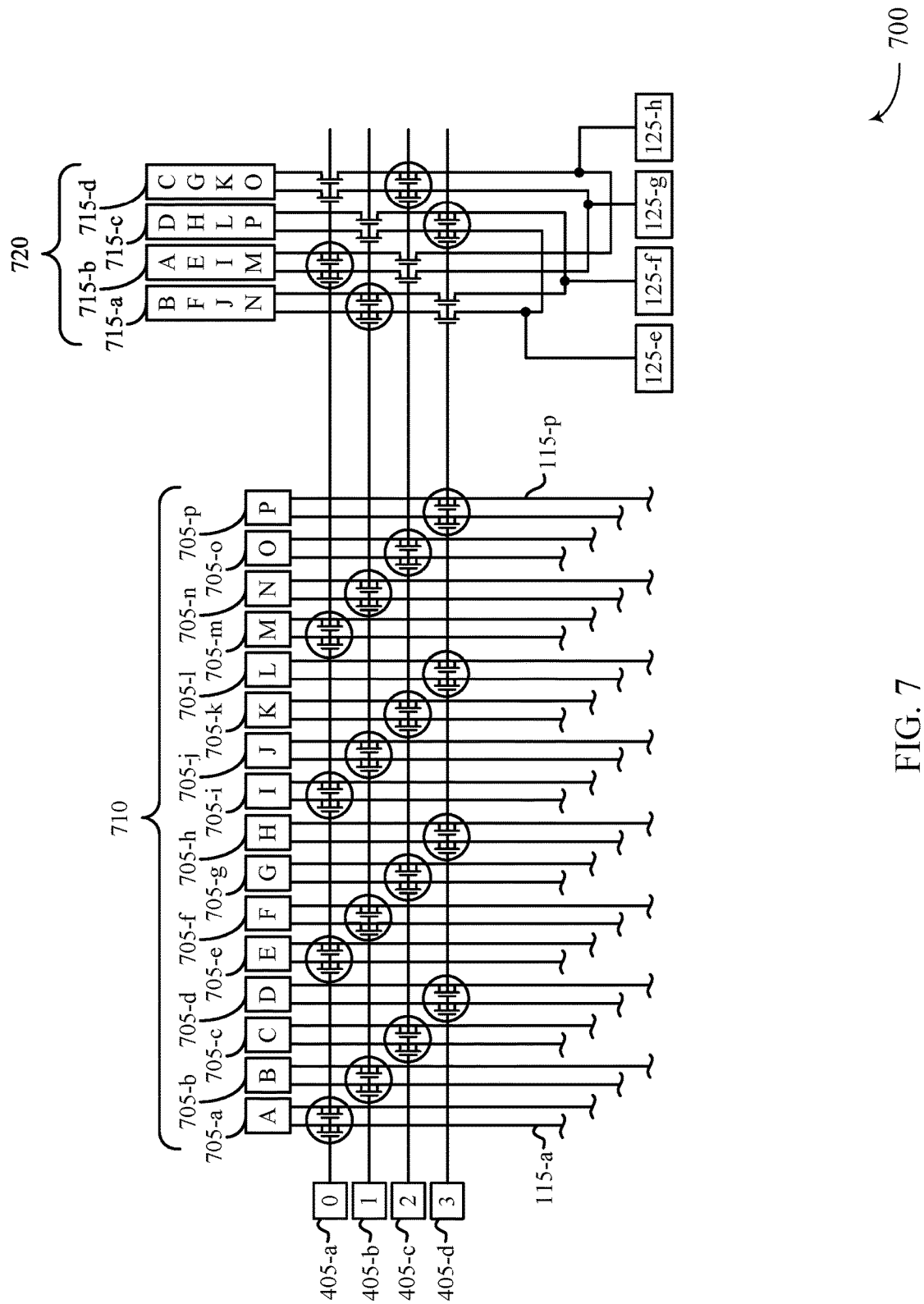
FIG. 7 illustrates an example of a memory array and other components of a memory array that supports a redundancy array column decoder for memory in accordance with embodiments of the present disclosure.

The array 400 may also include shunt switching components 420 (e.g., 420-*a* to 420-*h*, 420-*i* to 420-*l*, and 420-*m* to 420-*t*, etc.). The shunt switching components 420 may be positioned at intersections of shunt control lines 405 and digit lines 115. The shunt switching components 420 may be configured to electronically couple a cell plate 210 to a ground, virtually ground, or a voltage source (e.g., Vss). As shown in more detail in FIG. 5, the shunt switching components 420 are connected in parallel with the selection switching components 415. The shunt switching components 420 are depicted in FIGS. 4, 6, and 7 to show positions of the shunt switching components 420 relative to the other components of the arrays 400, 600, and 700. The shunt switching components 420 are designed to isolate unselected memory cells or unselected cell plates from selected memory cells or selected cell plates during an access operation. During an access operation, voltages and/or currents may be induced on unselected memory cells, which may alter or affect the logic state stored on the unselected memory cells. By connecting a digit line 115 of an unselected memory cell or unselected cell plate 210 to ground or a virtual ground, a voltage cannot be induced on the digit line 115 and the logic state of the memory cell may remain undisturbed. The shunt switching components 420 may be similarly embodied as the selection component 220 or the selection switching component 415 discussed above. In some embodiments, the shunt switching components 420 may be or include a transistor and its operation may be controlled by applying a voltage to a transistor gate, where the voltage has a magnitude greater than the threshold magnitude of the transistor. In the figures, the shunt switching component 420 are denoted by symbols of transistors surrounded by a circle.

During an access operation, a memory controller (e.g., memory controller 140) of the array 400 may determine a selected memory cell on which to perform an access operation. As part of the access operation, the memory controller may select the cell plate to bias the ferroelectric memory cell, may select the associated word line 110 to connect the cell plate to sense component, and may select the associated digit line 115 of the array 400. When selecting these different lines, one or more unselected memory cells may be disturbed. For example, more than one memory cell or cell plate 210 may be accessed via a single plate 210. When the plate 210 is accessed, the unselected memory cells associated with the plate 210 may be disturbed. A memory controller may attempt to mitigate disturbances to unselected memory cells by isolating those memory cells from the selected memory cell. For example, the memory controller may electronically couple one or more unselected memory cells or unselected cell plates to a ground or virtual ground. To couple to a ground a virtual ground, the controller may select one or more shunt control lines 405 based at least in part on which unselected memory cells are to be isolated. Once selected, the shunt switching components 420 coupled to the selected shunt control lines 405 may be activated and the respective digit lines 115 connected to a ground or a virtual ground.

As shown in FIG. 4, the cell plate group 410-$b$ may be isolated from the word lines 110 (e.g., 110-$a$ to 110-$h$) such that the access lines are not in electronic communication with the cell plate group 410-$b$. Switching components of any type (e.g., selection switching components 415 and shunt switching components 420) are not positioned at the intersections of the word lines 110 and the digit lines 115-$i$ to 115-$l$. Instead, selection switching components 415-$i$ to 415-$l$ are positioned at the intersections of shunt control lines 405 and digit lines 115-$i$ to 115-$l$. In this way, the structure of the redundant portion of the array 400 may be designed to occupy less space of the array 400.

Figure 5:
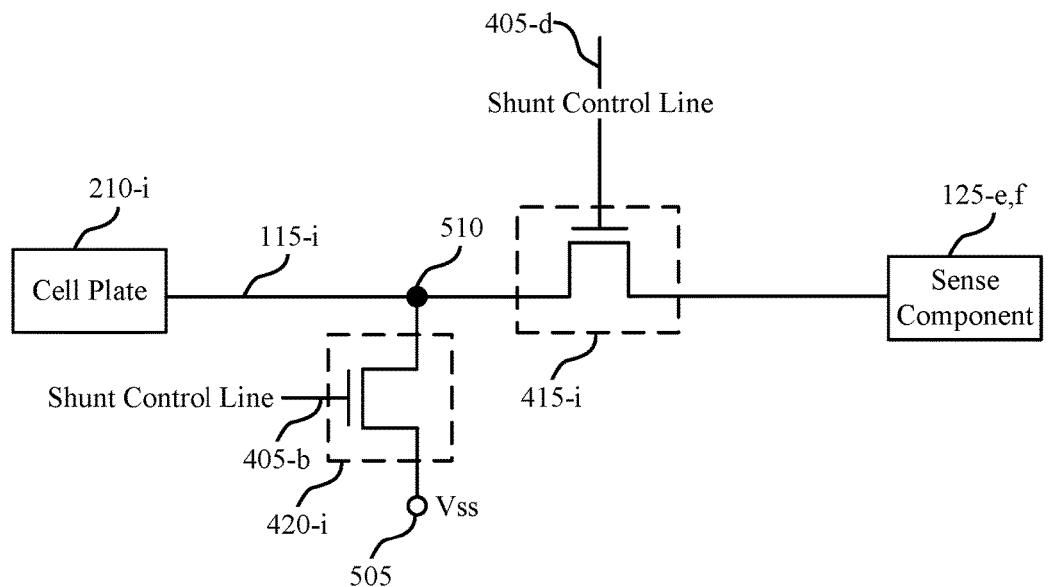
FIG. 5 illustrates an example of a digit line and other components that supports redundancy array column decoder for memory in accordance with embodiments of the present disclosure.

FIG. 5 illustrates an example of access circuitry 500 of a redundant cell plate 210 in accordance with various embodiments of the present disclosure. For example, FIG. 5 may illustrate an example of access circuitry to cell plate 210-i. However, the access circuitry 500 may also be used to describe the access circuitry to other cell plates 210.

The cell plate 210-$i$ may be coupled to either a sense component 125-$e$ or 125-$f$ or to virtual ground 505 (e.g., Vss). For example, if shunt control line 405-$b$ is selected, the shunt switching component 420-$i$ may be closed and node 510 on digit line 115-$i$ may be coupled to virtual ground. If shunt control line 405-$d$ is selected, the selection switching component 415-$i$ may be closed and the node 510 on the digit line 115-$i$ may be coupled to a sense component 125-$e$ or 125-$f$. As is discussed herein, the configurations of the shunt control lines 405 and the switching components 415, 420 may be selected based on a number of relationships between the cell plate groups 410-$a$, 410-$b$, 410-$c$ such that any given digit line 115 may not be connect to both a virtual ground 505 and a sense component 125 at the same time.

In some examples, the relative locations of the selection switching component 415 and the shunt switching component 420 may be switched such that the selection switching component 415 may be positioned closer to the cell plate 210. For example, see the access circuitry associated with cell plates 210-$k$, 210-$l$. In some examples, the selection switching component 415 may be electronically coupled to a word line 110. For example, see the access circuitry associated with cell plates 210-$a$ to 210-$h$ and 210-$m$ to 210-$t$.

Each redundant cell plate 210-$i$, 210-$j$, 210-$k$, 210-$l$ may be associated with one or more normal cell plates 210-$a$ to 210-$h$, 210-$m$ to 210-$t$. For example, in the illustrative example of FIG. 4, redundant cell plate 210-$j$ may be associated with normal cell plate 210-$a$ and normal cell plate 210-$e$. These associations between redundant cell plates and normal cell plates may be based at least in part on one or more relationships between the normal cell plate groups 410-$a$, 410-$c$ and the shunt control lines 405. The association of a redundant cell plate 210 and a normal cell plate 210 may be based at least in part on a subset of cell plates 210 of a normal plate group (e.g., 410-$a$) electronically coupled to a single shunt control line 405

FIG. 6 illustrates an example of a portion 600 of the array 400 in accordance with various embodiments of the present disclosure. The portion 600 has been selected to illustrate one or more relationships between normal cell plates and redundant cell plates. A configuration of shunt switching components 420 associated with cell plate group 410-$b$ may be based at least in part on a subset 605 of memory cells of the cell plate group 410-$a$. A configuration of selection switching components 415 associated with cell plate group 410-$b$ may be based at least in part on a subset 610 of memory cells of the cell plate group 410-$a$. For illustrative purposes, FIG. 6 shows only the configurations relative to a single shunt control line 405-$a$. However, it should be appreciated that the principles disclosed below may be adapted and applied to other shunt control lines as well (e.g., shunt control lines 405-$b$, 405-$c$, 405-$d$, etc.).

The subset 605 includes cell plate 210-$a$ and cell plate 210-$e$. The cell plate 210-$j$ may relate to cell plates of subset 605 based at least in part on the positions of shunt switching components 420-$a$, 420-$e$ on the shunt control line 405-$a$. Subset 605 may be determined based on which cell plates 210 of the cell plate group 410-$a$ are electronically coupled to the shunt control line 405-$a$ via shunt switching components 420. The shunt switching component 420-$j$ is positioned on the shunt control line 405-$a$ and is configured to connect cell plate 210-$j$ to a virtual ground when shunt control line 405-$a$ is selected.

The subset 610 includes cell plate 210-$c$ and cell plate 210-$g$. The cell plate 210-$l$ may relate to cell plates of subset 610 based at least in part on the positions of cell plates of subset 610 relative to subset 605. In the illustrative embodiment, at least one cell plate is between a cell plate of subset 605 and a cell plate of subset 610. In some examples, cell plates of subset 610 may be determined based on the distance of those cell plates from the cell plates of subset 605 (which relates to the positions of shunt switching components on a single shunt control line). In this manner, the coupling between activated cell plates and shunted cell plates may be further reduced. The selection switching component 415-$l$ is positioned on the shunt control line 405-$a$ and is configured to connect the cell plate 210-$l$ to a sense component 125-$g$ or sense component 125-$h$ when the shunt control line 405-$a$ is selected. In some examples, the subset 610 may be determined based on which cell plates 210 of the cell plate group 410-$a$ are electronically coupled to a different shunt control line 405 (e.g., shunt control lines 405-$b$, 405-$c$, 405-$d$) via shunt switching components 420.

Returning to FIG. 4, the sense components 125 may be positioned to electronically couple to different digit lines 115 of their respective cell plate groups 410. In some examples, the number of sense components 125 coupled to the cell plate group 410-$a$ is equal to the number of sense components 125 coupled to the cell plate group 410-$b$.

In accordance with various embodiments of the present disclosure, additional elements are contemplated, although each may not be explicitly labeled or shown. For example, in addition to digit lines 115-$a$ (relating to cell plate 210-$a$) array 400 may include additional digit lines 115 relating to other cell plates 210. In some examples, multiple digit lines 115-$a$ extend from the cell plate 210-$a$. For example, in addition to selection switching component 415-$a$ (relating to cell plate 210-$a$), array 400 may include additional selection switching components 415 relating to other cell plates 210.

For example, in addition to shunt switching component 420-a (relating to cell plate 210-a), array400 may include additional selection switching components 415 relating to other cell plates 210.

FIG. 7 illustrates an example of a memory array 700 and other components that support a redundancy array column decoder for ferroelectric memory in accordance with various embodiments of the present disclosure. Memory array 700 may be similarly embodied as memory array 400 described above. Array 700 illustrates how normal cell plates 705 in a normal cell plate group 710 may relate to redundant cell plates 715 in a redundant cell plate group 720 when there are sixteen normal cell plates 705 and four redundant cell plates 715. In the illustrative example, each redundant cell plate 715 may be associated with four normal cell plates 705. The relationships defining the configurations of switching components may be the same relationships as those described above with regard to array 400. In some examples, the number of redundant cell plates 715 may be an integer multiple of the number of normal cell plates 705.

Figure 8:
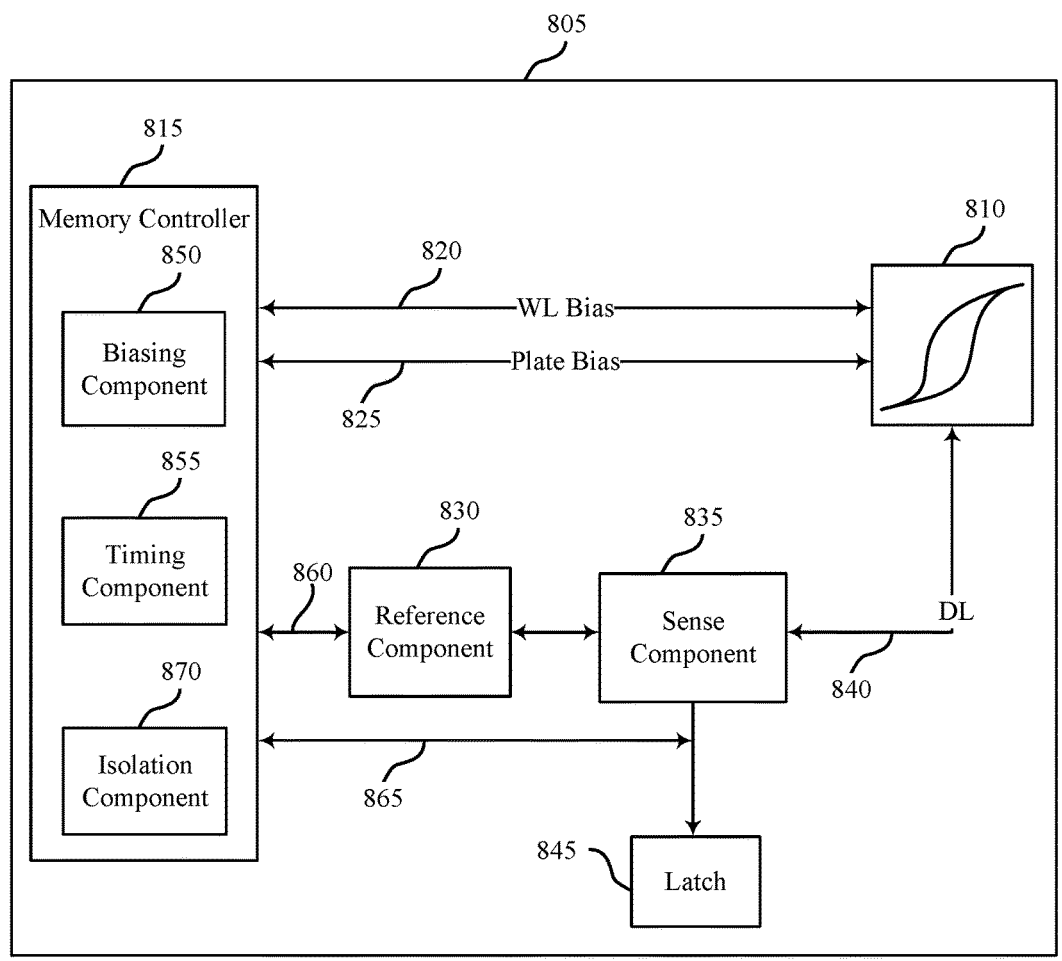
FIG. 8 illustrates a memory array that supports a redundancy array column decoder for memory in accordance with embodiments of the present disclosure.

FIG. 8 shows a block diagram 800 of a memory array 805 that that supports a redundancy array column decoder for memory in accordance with various embodiments of the present disclosure. Memory array 805 may be referred to as an electronic memory apparatus, and may be an example of a component of a memory array 100 as described with reference to FIG. 1. In some examples, array 805 may be an example of a component of array 400 as described with reference to FIG. 4.

Memory array 805 may include one or more memory cells 810, a memory controller 815, a word line 820, a plate line 825, a reference component 830, a sense component 835, a digit line 840, and a latch 845. These components may be in electronic communication with each other and may perform one or more of the functions described herein. In some cases, memory controller 815 may include biasing component 850, timing component 855, and isolation component 870.

Memory controller 815 may be in electronic communication with word line 820, digit line 840, sense component 835, and plate line 825, which may be examples of word line 110, digit line 115, sense component 125, and plate line 210 described with reference to FIGS. 1, and 2. Memory array 805 may also include reference component 830 and latch 845. The components of memory array 805 may be in electronic communication with each other and may perform embodiments of the functions described with reference to FIGS. 1 through 7. In some cases, reference component 830, sense component 835, and latch 845 may be components of memory controller 815.

In some examples, digit line 840 is in electronic communication with sense component 835 and a ferroelectric capacitor of ferroelectric memory cells 810. A ferroelectric memory cell 810 may be writable with a logic state (e.g., a first or second logic state). Word line 820 may be in electronic communication with memory controller 815 and a selection component of ferroelectric memory cell 810. Plate line 825 may be in electronic communication with memory controller 815 and a plate of the ferroelectric capacitor of ferroelectric memory cell 810. Sense component 835 may be in electronic communication with memory controller 815, digit line 840, latch 845, and reference line 860. Reference component 830 may be in electronic communication with memory controller 815 via reference line 860. Sense control line 865 may be in electronic communication with sense component 835 and memory controller 815. These components may also be in electronic communication with other components, both inside and outside of memory array 805, in addition to components not listed above, via other components, connections, or busses.

Memory controller 815 may be configured to activate the word line 820, plate line 825, or digit line 840 by applying voltages to those various nodes. For example, biasing component 850 may be configured to apply a voltage to operate memory cell 810 to read or write memory cell 810 as described above. In some cases, memory controller 815 may include a row decoder, column decoder, or both, as described with reference to FIG. 1. This may enable the memory controller 815 to access one or more memory cells 105. Biasing component 850 may also provide voltage potentials to reference component 830 in order to generate a reference signal for sense component 835. Additionally, biasing component 850 may provide voltage potentials for the operation of sense component 835.

In some cases, memory controller 815 may perform its operations using timing component 855. For example, timing component 855 may control the timing of the various word line selections or plate biasing, including timing for switching and voltage application to perform the memory functions, such as reading and writing, discussed herein. In some cases, timing component 855 may control the operations of biasing component 850.

In some cases, memory controller 815 may perform its operations using isolation component 870. For example, isolation component 870 may control which memory cells or cell plates are electronically coupled to a ground or a virtual ground during an access operation.

Reference component 830 may include various components to generate a reference signal for sense component 835. Reference component 830 may include circuitry configured to produce a reference signal. In some cases, reference component 830 may be implemented using other ferroelectric memory cells 105. Sense component 835 may compare a signal from memory cell 810 (through digit line 840) with a reference signal from reference component 830. Upon determining the logic state, the sense component may then store the output in latch 845, where it may be used in accordance with the operations of an electronic device that memory array 805 is a part. Sense component 835 may include a sense amplifier in electronic communication with the latch and the ferroelectric memory cell.

Memory controller 815 may be an example of the memory controller 915, or elements of the memory controller 915, described with reference to FIG. 9.

In some examples, the memory array 805 may include a first portion of a memory array that includes a first number of memory cells, a second portion of the memory array that includes a second number of memory cells, wherein the first number is an even integer multiple of the second number, a set of shunt control lines in electronic communication with the memory cells of the first portion of the memory array and at least one memory cell of the second portion of the memory array, a first set of switching components coupled with the shunt control lines and associated with the first portion of the memory array, and a second set of switching components coupled with the shunt control lines and associated with the second portion of the memory array, wherein a configuration of the second set of switching components with respect to the memory cells of the second portion of the memory array is based at least in part on a configuration of the first set of switching components with respect to the memory cells of the first portion of the memory array.

In some examples, the configuration of the first set of set of switching components with respect to the memory cells of the first portion of the memory array may be based at least in part on a cyclic shift of the memory cells of the first portion of the memory array. In some examples, the second set of switching components may include a first subset of switching components, and a second subset of switching components. In some examples, the first subset of switching components may couple the memory cells of the second portion of the memory array to ground or virtual ground. In some examples, the second subset of switching components may couple each memory cell of the second portion of the memory array to a sense amplifier.

In some examples, a configuration of the first subset of switching components with respect to the memory cells of the second portion of the memory array may be based at least in part on the configuration of the first set of switching components with respect to the memory cells of the first portion of the memory array, a configuration of the second subset of switching components with respect to the memory cells of the second portion of the memory array may be based at least in part on the configuration of the first set of switching components with respect to the memory cells of the first portion of the memory array, and the configuration of the first subset of switching components may be different from the configuration of the second subset of switching components.

In some examples, the configuration of the first subset of switching components and the configuration of the second subset of switching components may be based at least in part on a subset of memory cells of the first portion of the memory array coupled to a single shunt control line. In some examples, a first memory cell of the second portion of the memory array may be associated with the subset of memory cells of the first portion of the memory array, and at least one switching component of the first subset of switching components may be positioned on the single shunt control line and is in electronic communication with the first memory cell of the second portion of the memory array. In some examples, a second memory cell of the second portion of the memory array may be unassociated with any memory cell in the subset of memory cells of the first portion of the memory array, and at least one switching component of the second subset of switching components may be positioned on the single shunt control line and is in electronic communication with the second memory cell of the second portion of the memory array.

In some examples, the memory array 805 may include a set of access lines in electronic communication with the first portion of the memory array and isolated from the second portion of the memory array. In some examples, the memory array 805 may include a third portion of the memory array that may include the first number of memory cells, and a third set of switching components may be coupled with the shunt control lines and associated with the third portion of the memory array, a configuration of the third set of switching components with respect to the memory cells of the third portion of the memory array may be based at least in part on the configuration of the first set of switching components with respect to the memory cells of the first portion of the memory array.

In some examples, the at least one memory cell of the second portion of the memory array may be redundant to at least one memory cell of the first portion of the memory array. In some examples, the at least one memory cell of the second portion of the memory array may be redundant to at least one memory cell of the first portion of the memory array. In some examples, a number of switching components of the second set may be an integer multiple of the second number of memory cells. In some examples, the array 805 may include a first set of sense amplifiers coupled to the memory cells of the first portion of the memory array, and a second set of sense amplifiers coupled to the memory cells of the second portion of the memory array.

In other examples, the memory array 805 may include a first portion of a memory array that includes a first number of memory cells, a second portion of the memory array that includes a second number of memory cells, wherein the first number is an integer multiple of the second number, and a number of shunt control lines in electronic communication with the memory cells of the first portion of the memory array and the memory cells of the second portion of the memory array, wherein the second number of memory cells in the second portion of the memory array is equal to the number of shunt control lines.

In some examples, a subset of memory cells from the first portion of the memory array may be coupled to a single shunt control line, and a single memory cell of the second portion of the memory array corresponds to the subset of memory cells and may be coupled to the single shunt control line.

In some examples, the memory array 805 may include a set of first switching components in electronic communication with the number of shunt control lines, wherein the first set of switching components may couple the memory cells of the first portion of the memory array and the memory cells of the second portion of the memory array to ground or virtual ground. In some examples, the memory array 805 may include a second set of switching components in electronic communication with the number of shunt control lines, wherein the second set of switching components may couple the memory cells of the second portion of the memory array to sense amplifiers.

In other examples, the memory array 805 may include a memory array that may include a first portion and a second portion with at least one cell redundant to a cell of the first portion, wherein a first number of memory cells of the first portion may be an integer multiple of a second number of memory cells of the second portion, at least one shunt control line, and a controller in electronic communication with the memory array and the at least one shunt control line, wherein the controller may be operable to: access a memory cell of the first portion of the memory array during an access operation, and isolate a memory cell of the second portion of the memory array during the access operation using the at least one shunt control line and based at least in part on accessing the memory cell of the first portion of the memory array.

Figure 9:
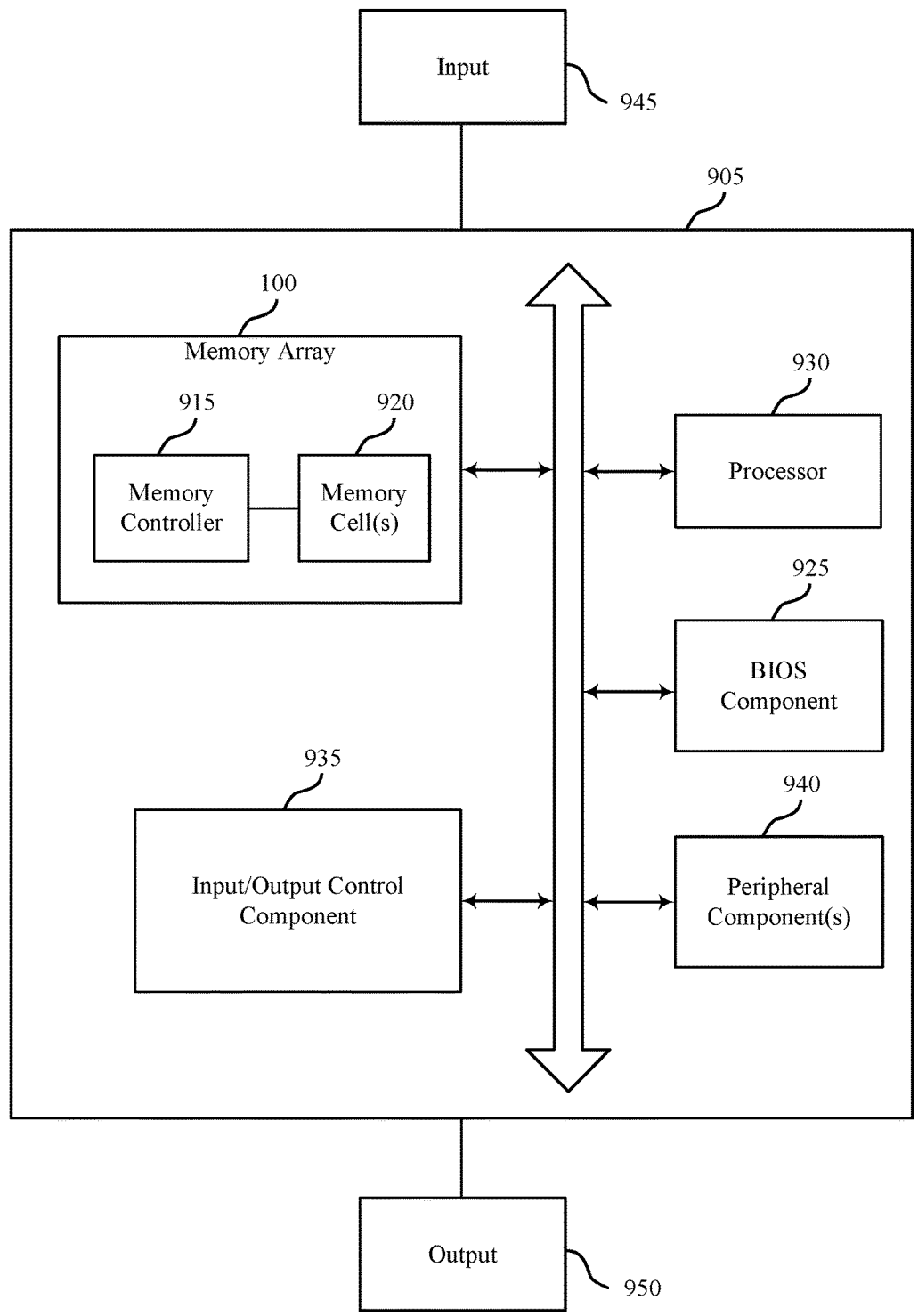
FIG. 9 illustrates a system, including a memory array, that supports a redundancy array column decoder for memory in accordance with embodiments of the present disclosure.

FIG. 9 shows a diagram of a system 900 including a device 905 that supports a redundancy array column decoder for memory in accordance with various embodiments of the present disclosure. Device 905 may be an example of or include the components of a memory array 100 as described above, e.g., with reference to FIG. 1.

Device 905 may include components for bi-directional voice and data communications including components for transmitting and receiving communications, including memory controller 915, memory cells 920, BIOS component 925, processor 930, I/O control component 935, and peripheral components 940.

Memory controller 915 may operate one or more memory cells as described herein. Specifically, memory controller 915 may be configured to support full bias sensing in a three-dimensional memory array. In some cases, memory controller 915 may include a row decoder, column decoder, or both, as described with reference to FIG. 1.

Memory cells 920 may store information (i.e., in the form of a logical state) as described herein.

BIOS component 925 be a software component that includes a basic input/output system (BIOS) operated as firmware, which may initialize and run various hardware components. BIOS component 925 may also manage data flow between a processor and various other components, e.g., peripheral components, input/output control component, etc. BIOS component 925 may include a program or software stored in read-only memory (ROM), flash memory, or any other non-volatile memory.

Processor 930 may include an intelligent hardware device, (e.g., a general-purpose processor, a digital signal processor (DSP), a central processing unit (CPU), a microcontroller, an application specific integrated circuit (ASIC), a field-programmable gate array (FPGA), a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., function or tasks supporting full bias sensing in a three-dimensional memory array).

Input/output (I/O) control component 935 may manage input and output signals for device 905. Input/output control component 935 may also manage peripherals not integrated into device 905. In some cases, input/output control component 935 may represent a physical connection or port to an external peripheral. In some cases, I/O control component 935 may utilize an operating system such as iOS®, ANDROID®, MS-DOS®, MS-WINDOWS®, OS/2®, UNIX®, LINUX®, or another known operating system.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O control component 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O control component 935.

The components of device 905 may include circuitry designed to carry out their functions. This may include various circuit elements, for example, conductive lines, transistors, capacitors, inductors, resistors, amplifiers, or other active or inactive elements, configured to carry out the functions described herein.

Figure 10:
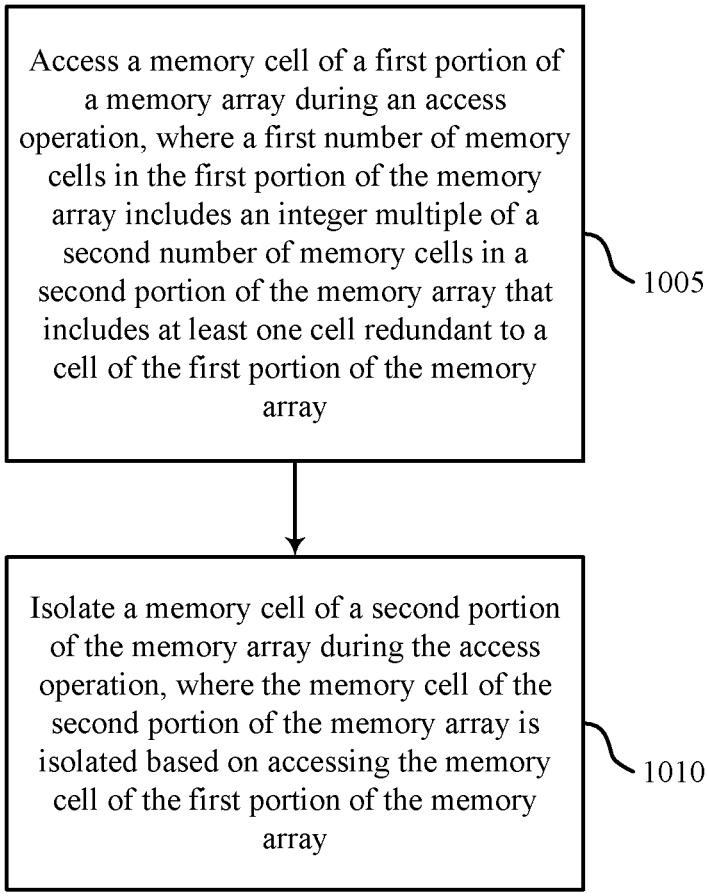
FIGS. 10 and 11 are flowcharts that illustrate methods for a redundancy array column decoder for memory in accordance with embodiments of the present disclosure.

FIG. 10 shows a flowchart illustrating a method 1000 for a redundancy array column decoder for memory in accordance with various embodiments of the present disclosure. The operations of method 1000 may be implemented by a memory controller 140 or its components as described herein. For example, the operations of method 1000 may be performed by a memory controller as described with reference to FIGS. 1, 8, and 9. In some examples, a memory controller 140 may execute a set of codes to control the functional elements of the device to perform the functions described below. Additionally or alternatively, the memory controller 140 may perform some or all of the functions described below using special-purpose hardware.

At block 1005 the memory controller 140 may access a memory cell of a first portion of a memory array during an access operation, wherein a first number of memory cells in the first portion of the memory array comprises an integer multiple of a second number of memory cells in a second portion of the memory array that includes at least one cell redundant to a cell of the first portion of the memory array. The operations of block 1005 may be performed according to the methods described with reference to FIGS. 1 through 7. In certain examples, operations of block 1005 may be performed by the isolation component 870 as described with reference to FIG. 8.

In some cases, the method may also include selecting a shunt control line during the access operation based at least in part on the memory cell of the first portion of the memory array that is accessed.

At block 1010 the memory controller 140 may isolate a memory cell of a second portion of the memory array during the access operation, wherein the memory cell of the second portion of the memory array is isolated based at least in part on accessing the memory cell of the first portion of the memory array. The operations of block 1010 may be performed according to the methods described with reference to FIGS. 1 through 7. In certain examples, operations of block 1010 may be performed by the isolation component 870 as described with reference to FIG. 8.

In some cases, the method may also include isolating a set of memory cells of the first portion of the memory array during the access operation, wherein the set of memory cells is isolated based at least in part on the shunt control line selected. In some cases, the method may also include comparing an identifier of the memory cell of the first portion of the memory array to an array mapping index that associates each memory cell of the first portion of the memory array with a memory cell of the second portion of the memory array. In some cases, the method may also include determining the shunt control line to selected based at least in part on the comparison. In some cases, the method may also include accessing a second memory cell of the second portion of the memory array based at least in part on the shunt control line selected.

Figure 11:
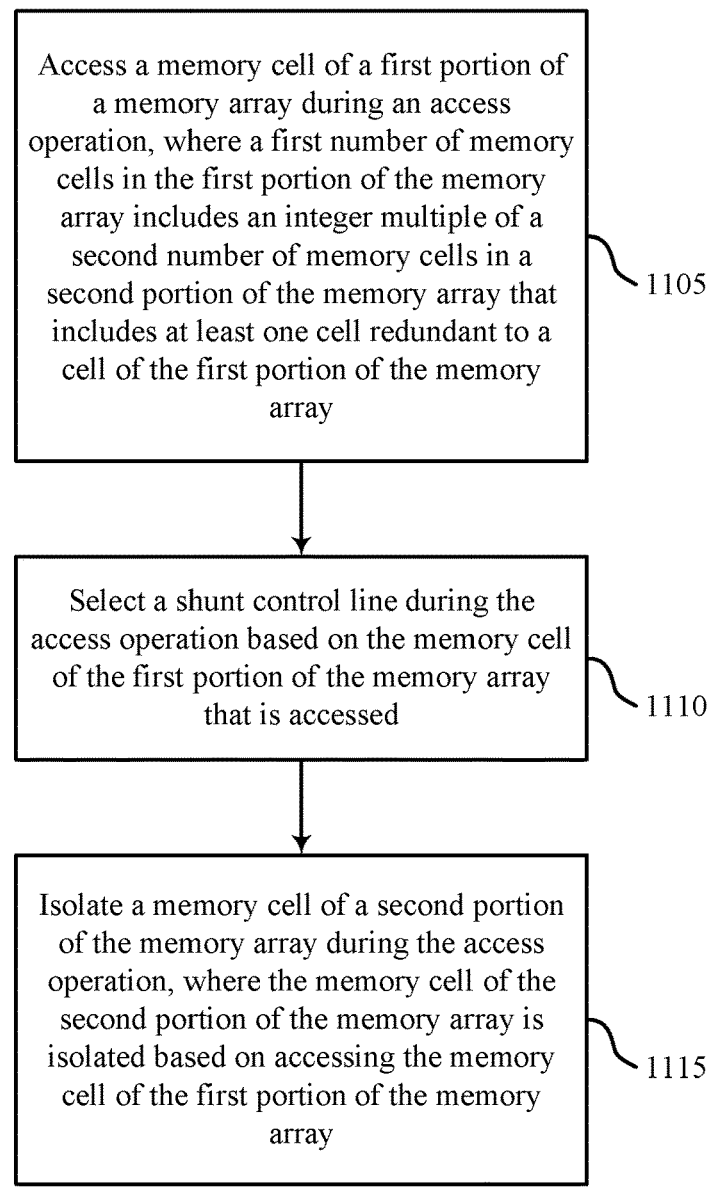

FIG. 11 shows a flowchart illustrating a method 1100 for a redundancy array column decoder for memory in accordance with various embodiments of the present disclosure. The operations of method 1100 may be implemented by a memory controller 140 or its components as described herein. For example, the operations of method 1100 may be performed by the isolation component 870 as described with reference to FIG. 8. In some examples, a memory controller 140 may execute a set of codes to control the functional elements of the device to perform the functions described below. Additionally or alternatively, the memory controller 140 may perform functions described below using special-purpose hardware.

At block 1105 the memory controller 140 may access a memory cell of a first portion of a memory array during an access operation, wherein a first number of memory cells in the first portion of the memory array comprises an integer multiple of a second number of memory cells in a second portion of the memory array that includes at least one cell redundant to a cell of the first portion of the memory array. The operations of block 1105 may be performed according to the methods described with reference to FIGS. 1 through 7. In certain examples, operations of block 1105 may be performed by the isolation component 870 as described with reference to FIG. 8.

At block 1110 the memory controller 140 may select a shunt control line during the access operation based at least in part on the memory cell of the first portion of the memory array that is accessed. The operations of block 1110 may be performed according to the methods described with reference to FIGS. 1 through 7. In certain examples, operations of block 1110 may be performed by the isolation component 870 as described with reference to FIG. 8.

At block 1115 the memory controller 140 may isolate a memory cell of a second portion of the memory array during the access operation, wherein the memory cell of the second portion of the memory array is isolated based at least in part on accessing the memory cell of the first portion of the memory array. The operations of block 1115 may be performed according to the methods described with reference to FIGS. 1 through 7. In certain examples, operations of block 1115 may be performed by the isolation component 870 as described with reference to FIG. 8.

In some cases, the method 1100 may isolate a set of memory cells of the first portion of the memory array during the access operation, wherein the set of memory cells is isolated based at least in part on the shunt control line selected. In some cases, the method 1100 may compare an identifier of the memory cell of the first portion of the memory array to an array mapping index that associates each memory cell of the first portion of the memory array with a memory cell of the second portion of the memory array, and determine the shunt control line to selected based at least in part on the comparison. In some cases, the method 1100 may access a second memory cell of the second portion of the memory array based at least in part on the shunt control line selected.

It should be noted that the methods described above describe possible implementations, and that the operations and the steps may be rearranged or otherwise modified and that other implementations are possible. Furthermore, elements or features from two or more of the methods may be combined.

The term 'access line' may be used interchangeable with the term 'common conductive line,' word line,' 'digit line,' bit line,' or other similar nomenclature. The term 'word line' may be used interchangeably with the term 'digit select line.' The term 'shunt control line' may be used interchangeable with the term 'digit line shunt line.'

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected to ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    accessing a first memory cell of a first portion of a memory array during an access operation, wherein a first number of memory cells in the first portion of the memory array comprises an integer multiple of a second number of memory cells in a second portion of the memory array that includes at least one cell redundant to the first memory cell of the first portion of the memory array;
    isolating a second memory cell of the second portion of the memory array during the access operation, wherein the second memory cell of the second portion of the memory array is isolated based at least in part on accessing the first memory cell of the first portion of the memory array;
    biasing a shunt control line during the access operation based at least in part on the first memory cell of the first portion of the memory array that is accessed; and
    isolating a third memory cell of the first portion of the memory array during the access operation based at least in part on biasing the shunt control line.

2. The method of claim 1, further comprising:
    activating a switching component coupled with the shunt control line, wherein isolating of the third memory cell of the first portion is based at least in part on activating the switching component.

3. The method of claim 1, further comprising:
accessing the second memory cell of the second portion of the memory array based at least in part on biasing the shunt control line.

4. The method of claim 1, wherein the integer multiple is greater than one.

5. The method of claim 1, further comprising:
comparing an identifier associated with the first portion of the memory array to an array mapping index, wherein biasing the shunt control line during the access operation is based at least in part on the comparison.

6. The method of claim 1, further comprising:
coupling the shunt control line with a virtual ground during the access operation based at least in part on accessing the first memory cell of the first portion of the memory array, wherein isolating the second memory cell is based at least in part on coupling the shunt control line with the virtual ground.

7. An apparatus, comprising:
a first portion of a memory array comprising a first number of memory cells;
a second portion of the memory array comprising a second number of memory cells and at least one memory cell redundant to a first memory cell of the first portion, wherein the first number of memory cells is an integer multiple of the second number of memory cells;
an access line coupled with at least one memory cell of the first number of memory cells and at least one memory cell of the second number of memory cells, wherein the access line is configured to isolate a second memory cell of the second portion of the memory array during an access operation; and
a first set of switching components coupled with the second portion of the memory array and the access line, wherein the access line is configured to isolate the second memory cell of the second portion of the memory array based at least in part on a configuration of the first set of switching components, the first set of switching components configured to connect the second memory cell of the second portion to a virtual ground or a sense component.

8. The apparatus of claim 7, further comprising:
a second set of switching components coupled with the first portion of the memory array and the access line, wherein the access line is configured to isolate the first memory cell of the first portion of the memory array based at least in part on a configuration of the second set of switching components.

9. The apparatus of claim 7, wherein the access line is configured to isolate the second memory cell of the second portion of the memory array during the access operation based at least in part on a selection of the first memory cell of the first portion of the memory array during the access operation.

10. The apparatus of claim 7, wherein the access line comprises a shunt control line.

11. The apparatus of claim 7, wherein the integer multiple is greater than one.

12. An apparatus, comprising:
a memory array comprising a first portion and a second portion;
an access line coupled with each of the first portion of the memory array and the second portion of the memory array;
a switching component coupled with the access line; and
a controller in electronic communication with the memory array, wherein the controller is operable to the apparatus to:
activate access a first memory cell of the first portion of the memory array during an access operation, wherein a first number of memory cells in the first portion of the memory array comprises an integer multiple of a second number of memory cells in the second portion of the memory array that includes at least one memory cell redundant to at least one memory cell of the first portion of the memory array;
activate the switching component, wherein the switching component is coupled with a virtual ground; and
isolate a second memory cell of the second portion of the memory array during the access operation by activating the switching component, wherein the second memory cell of the second portion of the memory array is isolated based at least in part on accessing the first memory cell of the first portion of the memory array.

13. The apparatus of claim 12, wherein the controller is further operable to cause the apparatus to:
bias the access line coupled with the first portion of the memory array and the second portion of the memory array during the access operation, wherein isolating the second memory cell of the second portion is based at least in part on biasing the access line.

14. The apparatus of claim 13, wherein the controller is further operable to cause the apparatus to:
compare an identifier of the first memory cell of the first portion of the memory array to an array mapping index; and
bias the access line based at least in part on the comparison.

15. The apparatus of claim 12, further comprising:
a plurality of access lines coupled with the first portion of the memory array and the second portion of the memory array, wherein the plurality of access lines comprises the access line; and
a plurality of switching components coupled with each of the plurality of access lines, wherein the plurality of switching components comprises the switching component.

* * * * *